United States Patent
Trinh Van et al.

[11] Patent Number: 5,146,155
[45] Date of Patent: Sep. 8, 1992

[54] DIGITAL MEASURING CIRCUIT FOR MEASURING AN ELECTRICAL SIGNAL

[75] Inventors: Christian Trinh Van, Brunoy; Lydie Desperben, Bois Colombes, both of France

[73] Assignee: Alcatel N.V., Amsterdam, Netherlands

[21] Appl. No.: 633,503

[22] Filed: Dec. 27, 1990

[30] Foreign Application Priority Data

Jan. 5, 1990 [FR] France .................. 90 00088

[51] Int. Cl.[5] .................. G01R 17/06; G01R 15/08; H03M 1/18
[52] U.S. Cl. .................. 324/99 D; 324/115; 341/139
[58] Field of Search .................. 324/99 D, 115, 111; 341/139

[56] References Cited

U.S. PATENT DOCUMENTS

| | | | |
|---|---|---|---|
| 3,149,282 | 9/1964 | Wasserman | 324/99 D |
| 3,187,323 | 6/1965 | Flood et al. | 324/115 |
| 3,685,047 | 8/1972 | Sherer et al. | 341/139 |
| 3,790,886 | 2/1974 | Kurtin et al. | 324/99 D |
| 4,383,247 | 5/1983 | Assard | 341/139 |
| 4,831,378 | 5/1989 | Baars et al. | 341/139 |
| 4,876,502 | 10/1989 | Verbanets et al. | 324/99 D |
| 4,906,928 | 3/1990 | Gard | 341/139 |

FOREIGN PATENT DOCUMENTS 2234709 1/1975 France .

*Primary Examiner*—Ernest F. Karlsen
*Attorney, Agent, or Firm*—Christie, Parker & Hale

[57] ABSTRACT

The present invention relates to a measurement circuit for providing the digital value of an analog electrical signal. The digital measurement circuit for measuring an analog electrical signal produces a measurement signal (M) and includes an amplifier (1) which receives said electrical signal (I), followed by an analog-to-digital converter (2) which delivers digital data (N). The gain of the amplifier (1) is controlled by a control signal (C) and said gain can take up at least two values. The measurement circuit further includes a control unit (3) producing said control signal (C) and storing the digital data corresponding to different gain values, and includes means for producing the measurement signal (M) on the basis of said digital data (N).

4 Claims, 1 Drawing Sheet

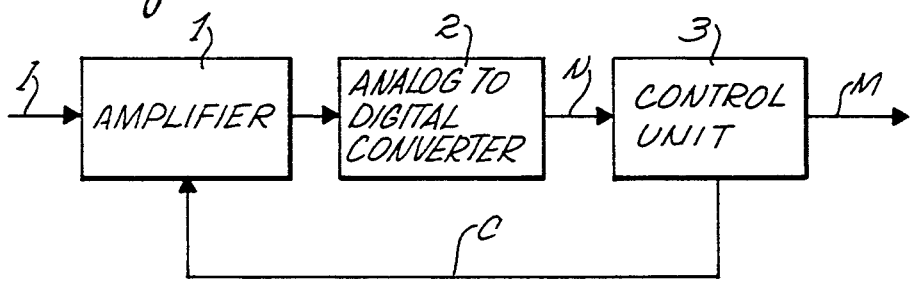
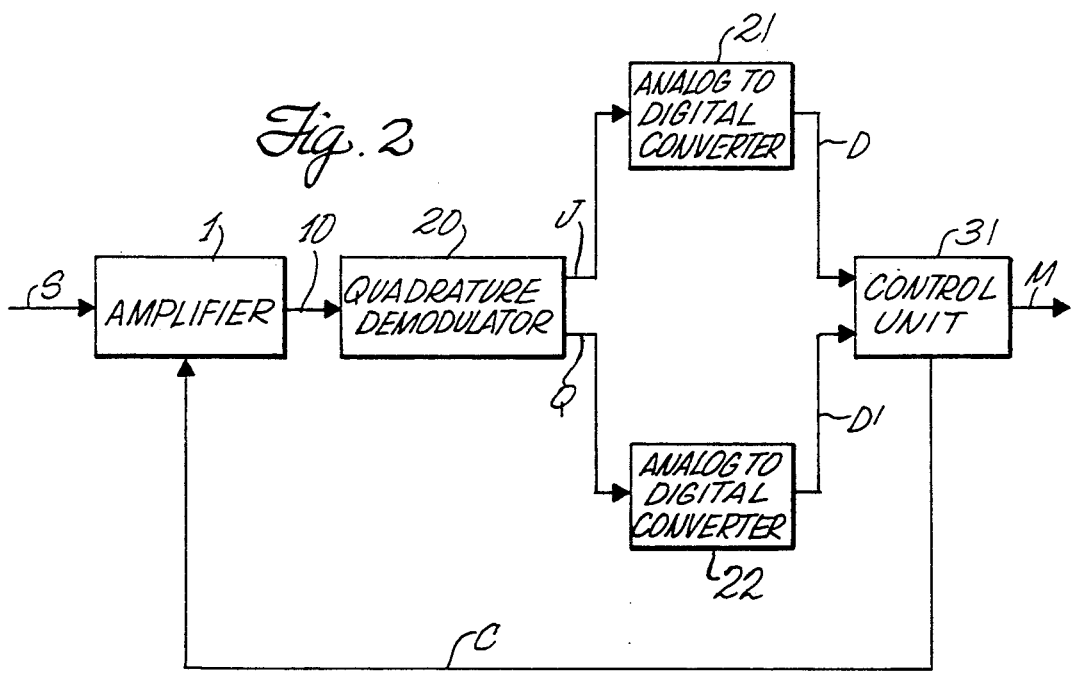

DIGITAL MEASURING CIRCUIT FOR MEASURING AN ELECTRICAL SIGNAL

The present invention relates to a measuring circuit which gives the digital value of an electrical signal.

The electrical signal to be measured is an analog signal that may take various values between a maximum value and a minimum value. The ratio of the maximum to minimum values defines the dynamic range of the signal. It is thus conventional to use an analog-to-digital converter whose own dynamic range is greater than that of the signal for the purpose of obtaining a digital measurement of such a signal. The dynamic range of a converter is defined in the same manner as that of a signal and corresponds to the largest number it is capable of generating, where the smallest number is taken to be equal to unity. The dynamic range is thus a function of the number of bits provided by the converter.

When the signal has a relatively small dynamic range, e.g. corresponding to an 8-bit converter, this solution is well adapted since converters of this type are common and cheap. However, if the dynamic range of the signal is larger, it turns out to be very expensive to use a converter having a larger dynamic range, e.g. 12 bits.

Since the solution is not advantageous, another solution has been developed, in particular as described in U.S. Pat. No. 4,383,247, which consists in using a variable gain amplifier to receive the electrical signal and to relay it to an analog-to-digital converter of small dynamic range, with the digital data provided by the converter defining the value of the amplifier gain. Gain control is thus performed in a servo-control loop and such a circuit is subject to the known limitations inherent to servo-control systems.

An object of the present invention is thus to provide a measurement circuit which gives the digital value of an electrical signal, the circuit including a variable gain amplifier and an analog-to-digital converter, but avoiding the use of a servo-control loop.

The present invention provides a digital measurement circuit for measuring an analog electrical signal and producing a measurement signal, the measurement circuit comprising an amplifier receiving the electrical signal and having its gain controlled by a control signal, the amplifier being followed both by at least one analog-to-digital converter which delivers digital data, and by a control unit for producing said control signal, thereby enabling said gain to take at least two values, the measurement circuit being characterized in that during a measurement cycle said control unit produces said control signal successively in its at least two states, stores the values of said digital data corresponding to said states, and includes means for producing said measurement signal on the basis of said stored digital data values.

In addition, in the digital measurement circuit for measuring an analog electrical signal, said measurement signal is calculated on the basis of average values of said digital data (N) associated with respective one of said at least two gain values.

In an embodiment of the digital measurement circuit for measuring an electrical signal, said control unit stores a saturation threshold, stores a value $N_1$ from said converter for a gain $G_1$ of said amplifier, stores a value $N_2$ from said converter for a gain $G_2$ of said amplifier, where $G_1$ is less than $G_2$, and produces a measurement signal which is equal to $N_1/G_1$ is $N_2$ is greater than said saturation threshold, and which is otherwise equal to $N_2/G_2$.

The digital measurement circuit for measuring an analog electrical signal is advantageously applied to measuring a sinewave signal which is modulated in phase or in frequency, wherein said control unit generates said digital data by taking the square root of the sum of the squares of two digital values, said digital values being delivered by two of said analog-to-digital converters each receiving a respective one of two baseband signals from a quadrature demodulator, said demodulator receiving said sinewave signal via said amplifier.

The various objects and characteristics of the invention appear in greater detail in the following description of embodiments given by way of non-limiting example and with reference to the accompanying drawing, in which:

FIG. 1 is a block diagram of a first embodiment of the digital measurement circuit of the invention for measuring an analog signal, and FIG. 2 is a block digram of an application of the digital measurement circuit.

Identical items present in both figures are given the same references.

Although the invention is applicable to a varying signal, it is assumed initially that the signal remains constant in value throughout the duration of a measurement.

The digital measurement circuit shown in FIG. 1 receives an analog input signal I and produces a digital measurement signal M. It essentially comprises an amplifier 1 followed by an analog-to-digital converter 2, itself followed by a control unit 3.

The input signal I varies between a minimum value $I_m$ and a maximum value $I_M$.

The amplifier 1 is a circuit whose gain can be controlled in discrete steps by a control signal C. Such circuits are known and are constituted, for example, by an operational amplifier associated with a network of resistors with the resistors being switched in order to vary amplifier gain. It could also be constituted by a fixed-gain amplifier followed or preceded by an attenuator whose attenuation is caused to vary. In addition, although it is shown as constituting a single module, the variable-gain amplifier could be physically built up from a plurality of components disposed along the measurement circuit, and each of the components may have variable gain or attenuation. In the example shown, the amplifier 1 is a single amplifier and it has two gain values $G_1$ and $G_2$, where $G_1$ is less $G_2$.

The analog-to-digital converter 2 has sensitivity S which represents the smallest signal it is capable of detecting. It has a dynamic range D, i.e. it can distinguish signals lying anywhere in the range S to $S \times D$. It produces a digital value N.

Given the specification of the input signal I, the various digital values mentioned must satisfy certain relationships:

$$I_m \times G_2 \geq S$$

$$I_M \times G_1 \leq S \times D$$

The control unit 3 produces a digital measurement signal M which is the value of the input signal I. The observation time interval during which measurement is performed is subdivided into four portions defining a measurement cycle:

during the first portion, the control unit produces a control signal C which imposes gain $G_1$ on the amplifier 1;

thereafter, it stores the value $N_1$ delivered by the converter 2;

during the third portion it switches the gain of the amplifier to $G_2$ by means of the control signal C; and finally, it stores the value $N_2$ delivered by the converter 2.

The control unit also memorizes a saturation threshold which is compared with the value $N_2$. If $N_2$ exceeds this threshold, the measurement is declared invalid and the control unit produces a measurement M equal to $N_1/G_1$. Otherwise, the control unit provides a signal having the value $N_2/G_2$. Without going beyond the scope of the invention, the control unit could produce a measurement signal in any other way. For example, it could cause all input signals I lying between two determined values to correspond to a single value.

Thus, by using an 8-bit converter possessing a dynamic range of 48 dB, it is possible to measure an input signal having a dynamic range of 64 dB, which would normally require an 11-bit converter to be used. It should be noted that in this configuration the digital measurement circuit could theoretically accept an input signal having a dynamic range of 96 dB assuming that the difference between $G_1$ and $G_2$ is 48 dB. This configuration is easily generalized to cases where the amplifier 1 can be switched over more than two gains. Similarly, the invention is not limited to using an 8-bit converter.

The invention has been described on the assumption that the control unit 3 acquires data once only for each given gain value. Measurement can be made more reliable by multiplying the number of times data is acquired during the observation period, e.g. by acting on the sampling frequency of the converter. The control unit then produces a result which is an average value.

So far, the input signal I has been assumed to be constant throughout the observation time interval. The invention is equally applicable when this is not true.

For example, if the peak value of a periodic signal is to be measured, this signal is injected into a conventional peak detection circuit prior to being applied to the digital measurement circuit.

The invention is particularly applicable when there is a need to measure the level of a sinewave signal that is modulated in phase or in frequency.

In this application, shown diagrammatically in FIG. 2, the signal S is applied to an amplifier 1 which is identical to that described above. This amplifier is followed by a quadrature demodulator 20 which receives the amplified signal S and which delivers two baseband signal J and Q at a phase offset of $\pi/2$ relative to the carrier frequency of the signal S. These signals J and Q are applied to two respective analog-to-digital converters 21 and 22 identical to the converter 2 of FIG. 1 and producing digital data D and D'.

A control unit 31 which receives both sets of digital data generates the above-defined digital value N by taking the square root of the sum of the squares of D and D' as follows from the sinewave nature of the input signal. Digital processing then continues in accordance with the procedure described above.

The invention is applicable providing the modulating frequency is much less than the carrier frequency. It must be assumed that the input signal S conserves the same phase for the period of time equivalent to one-fourth of the period of the carrier. The error due to this assumption is greatly reduced if the measurement signal M is the average of a large number of data acquisitions which can be achieved by the invention as described above.

We claim:

1. A digital measurement circuit for measuring an analog electrical signal and producing a measurement signal, the measurement circuit comprising an amplifier for amplifying the analog electrical signal with a gain corresponding to the state of a control signal having at least two states, the amplifier being followed by at least one analog-to-digital converter for converting the amplifier analog signal output by the amplifier into digital data the converter being followed by a control unit having an input for receiving said digital data, a first output for providing said control signal and a second output for providing said measurement signal, wherein said control unit produces during a signal measurement cycle said control signal in its at least two states, thereby causing the gain of the amplifier to successively assume each of said at least two states during the single measurement cycle, stores the values of said digital data output by the converter during the single measurement cycle that correspond to said at least two states, and calculates said measurement signal from said stored digital data values.

2. A digital measurement circuit according to claim 1, wherein said control unit calculates said measurement signal on the basis of average values of said digital data associated with respective one of said at least two gain values.

3. A digital measurement circuit according to claim 1, wherein said control unit stores a saturation threshold, stores a value $N_1$ from said converter for a gain $G_1$ of said amplifier stores a value $N_2$ from said converter for a gain $G_2$ of said amplifier where $G_1$ is less than $G_2$, and sets the value of said measurement signal equal to $N_1/G_1$ if $N_2$ is greater than said saturation threshold, and equal to $N_2/G_2$ otherwise.

4. A digital measurement circuit according to claim 1, wherein said analog electrical signal is a sinewave signal which is modulated in phase or in frequency, said control unit takes the square root of the sum of the squares of two digital values each delivered by a different respective said analog-to-digital converter receiving a respective one of two baseband signals from a quadrature demodulator responsive to said amplifier analog signal output by said amplifier.

* * * * *